(12) United States Patent
Jin et al.

(10) Patent No.: US 8,477,545 B2
(45) Date of Patent: Jul. 2, 2013

(54) SEMICONDUCTOR APPARATUS

(75) Inventors: Sin Hyun Jin, Ichon-shi (KR); Jong Chern Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 219 days.

(21) Appl. No.: 12/839,297

(22) Filed: Jul. 19, 2010

(65) Prior Publication Data

US 2011/0188331 A1    Aug. 4, 2011

(30) Foreign Application Priority Data

Jan. 29, 2010 (KR) .......................... 10-2010-0008672

(51) Int. Cl.
*G11C 7/22* (2006.01)
*G11C 8/18* (2006.01)

(52) U.S. Cl.
USPC ........ 365/194; 365/193; 365/191; 365/233.1; 365/233.14; 365/233.5

(58) Field of Classification Search
USPC ............... 365/191, 193, 194, 233.1, 233.14, 365/233.5
See application file for complete search history.

(56) References Cited

U.S. PATENT DOCUMENTS

| | | | | |
|---|---|---|---|---|
| 5,465,076 A | * | 11/1995 | Yamauchi et al. | 331/179 |
| 5,731,726 A | * | 3/1998 | Farwell et al. | 327/277 |
| 6,025,745 A | * | 2/2000 | Lee et al. | 327/277 |
| 7,317,256 B2 | | 1/2008 | Williams et al. | |
| 7,598,523 B2 | | 10/2009 | Luo et al. | |
| 2004/0091096 A1 | * | 5/2004 | Chen et al. | 379/300 |
| 2006/0033544 A1 | * | 2/2006 | Hui et al. | 327/276 |
| 2007/0194822 A1 | * | 8/2007 | Kumata | 327/158 |
| 2008/0315388 A1 | | 12/2008 | Periaman et al. | |
| 2009/0020865 A1 | | 1/2009 | Su | |
| 2009/0134500 A1 | | 5/2009 | Kuo | |
| 2009/0166873 A1 | | 7/2009 | Yang et al. | |

FOREIGN PATENT DOCUMENTS

KR    10-1046273    6/2011

* cited by examiner

*Primary Examiner* — J. H. Hur
(74) *Attorney, Agent, or Firm* — William Park & Associates Patent Ltd.

(57) ABSTRACT

A semiconductor apparatus includes a plurality of stacked chips. At least two of the chips are configured to receive a column command and generate a column control signal based on the column command. Generation timing of the column control signal generated based on a column command in one of the at least two chips substantially coincide with the generation timing in the other of the at least two of the plurality of chips.

11 Claims, 3 Drawing Sheets

SEMICONDUCTOR APPARATUS

CROSS-REFERENCES TO RELATED APPLICATION

The present application claims priority under 35 U.S.C. §119(a) to Korean Application No. 10-2010-0008672, filed on Jan. 29, 2010, in the Korean Intellectual Property Office, which is incorporated herein by reference in its entirety as if set forth in full.

BACKGROUND

1. Technical Field

Various exemplary aspects of the present invention relate to semiconductor apparatuses and related methods. In particular, certain exemplary aspects relate to a three-dimensional semiconductor apparatus.

2. Related Art

In order to increase the degree of integration of a semiconductor apparatus, a 3D (three-dimensional) semiconductor apparatus has been developed. The 3D semiconductor apparatus includes a package of a plurality of stacked chips. The 3D semiconductor apparatus may achieve a maximum degree of integration in the same space by vertically stacking two or more chips.

The 3D semiconductor apparatus may be realized in a variety of ways. For example, a plurality of chips having the same structure may be stacked and connected together by wires such as metal wires, and are able to operate as a single semiconductor apparatus.

Recently, a TSV (through-silicon via) type semiconductor apparatus has been proposed. In a TSV type semiconductor apparatus, silicon vias are formed to pass through a plurality of stacked chips so that all the chips are electrically connected together. Since the through-silicon vias vertically pass through the respective chips in the TSV type semiconductor apparatus, the size of a package may be efficiently decreased compared to the semiconductor apparatus in which respective chips are connected through the wires.

The typical TSV type semiconductor apparatus is composed of a master chip and a plurality of slave chips which are electrically connected with the master chip through TSVs. For example, the master chip in a memory apparatus includes all logic circuits which are provided for the operation of the memory apparatus in a peripheral circuit region, and each of the slave chips includes its own memory core for data storage and circuits for the operation of the memory cores, so as to operate as a single semiconductor apparatus.

Since the plurality of chips stacked in a 3D semiconductor apparatus operate as a single semiconductor apparatus, they share data input and output. In the wired semiconductor apparatus, the data outputted from respective stacked chips may be transmitted to a controller through input/output lines. The data stored in the slave chips in a TSV semiconductor apparatus may be transmitted to the master chip and thereafter outputted externally through pads disposed on the master chip. In order to improve the operating speed of the semiconductor apparatus, it may be necessary to make the output timing of the data transmitted from the stacked chips coincide.

However, because the stacked chips have different characteristics due to variations in PVT (process, voltage and temperature), it may be difficult to manufacture them with a similar performance. More specifically, different PVT properties of the stacked chips create skews between the respective chips. Thus, a skew in data output timing may result between a chip having a high operating speed and a chip having a low operating speed. In order to secure a data valid window in the existence of the skew, the operating speed of the semiconductor apparatus should be lowered, which may not be desirable.

FIG. 1 is a diagram schematically illustrating the configuration of a conventional semiconductor apparatus. In FIG. 1, a semiconductor apparatus may be composed of first to third chips c1-c3. The first chip c1 operates as a master chip, and the second and third chips c2 and c3 operate as slave chips. The master chip c1 includes a command buffer 11, a data input buffer 13, a data alignment unit 15, a pipe latch unit 14, and a data output buffer 16. The slave chips c2 and c3 respectively include core units 21 and 31, write drivers 22 and 32, read drivers 23 and 33, and delay units 24 and 34.

The read and write operations of the semiconductor apparatus will be described below. In the read operation, a read command RD is externally applied to the command buffer 11, generating an internal read command RD_int from the read command RD. The internal read command RD_int is transmitted to the second and third chips c2 and c3 through first TSVs TSV1. The second and third chips c2 and c3 generate column control signals iostb and yi from the internal read command RD_int through the first and second delay units 24 and 34. In response to the column control signals iostb and yi, the data stored in the core units 21 and 31 are outputted to the read drivers 23 and 33. The read drivers 23 and 33 amplify the data and output the amplified data to data input/output lines GIO_c2 and GIO_c3. The data input/output lines GIO_c2 and GIO_c3 of the second and third chips c2 and c3 are connected with each other through second TSVs TSV2, and the data outputted from the second and third chips c2 and c3 are inputted to the pipe latch unit 14 of the first chip c1. The pipe latch unit 14 aligns the data transmitted through the second TSVs TSV2, and the data output buffer 16 buffers the aligned data and outputs the buffered data to a pad 17.

In the write operation, as a write command WT is applied to the command buffer 11, generating an internal write command WT_int. The internal write command WT_int may then be transmitted to the second and third chips c2 and c3 through the first TSVs TSV1. The data applied from the pad 17 may be transmitted to the second TSVs TSV2 through the data input buffer 13 and the data alignment unit 15. Accordingly, the write drivers 22 and 32 of the second and third chips c2 and c3 buffer the data applied through the second TSVs TSV2 and the data input/output lines GIO_c2 and GIO_c3 in response to column control signals wtstb and yi which are generated from the internal write command WT_int by the delay units 24 and 34. The buffered data are stored in the core units 21 and 31.

As illustrated above, the plurality of chips constituting the single semiconductor apparatus share the data input/output lines. Therefore, the timing when the data are outputted from the respective chips or the the data are stored in the respective chips should coincide with each other so as to secure a data valid window. However, because the characteristics of the respective chips are different due to variations in PVT, it is difficult to make the input and output timing of the data coincide with each other.

SUMMARY

In one embodiment of the present invention, a semiconductor apparatus has a plurality of chips stacked therein. At least two of the plurality of chips are configured to receive a column command and generate a column control signal based on the column command. Generation timing of the column control signal generated based on a column command in one of the at least two of the plurality of chips substantially coincide with the generation timing in the other of the at least two of the plurality of chips.

In another embodiment of the present invention, a semiconductor apparatus comprises: a first chip column control unit disposed in a first chip and configured to count a first number of times that a clock signal toggles during a first time period, variably delay an internal column command depending upon a first result of counting the first number, and generate a first chip column control signal; and a second chip column control unit disposed in a second chip and configured to count a second number of times the clock signal toggles during a second time period, variably delay the internal column command depending upon a second result of counting the second number, and generate a second chip column control signal.

BRIEF DESCRIPTION OF THE DRAWINGS

Features, aspects, and embodiments are described in conjunction with the attached drawings, in which.

DETAILED DESCRIPTION

Figure 1:
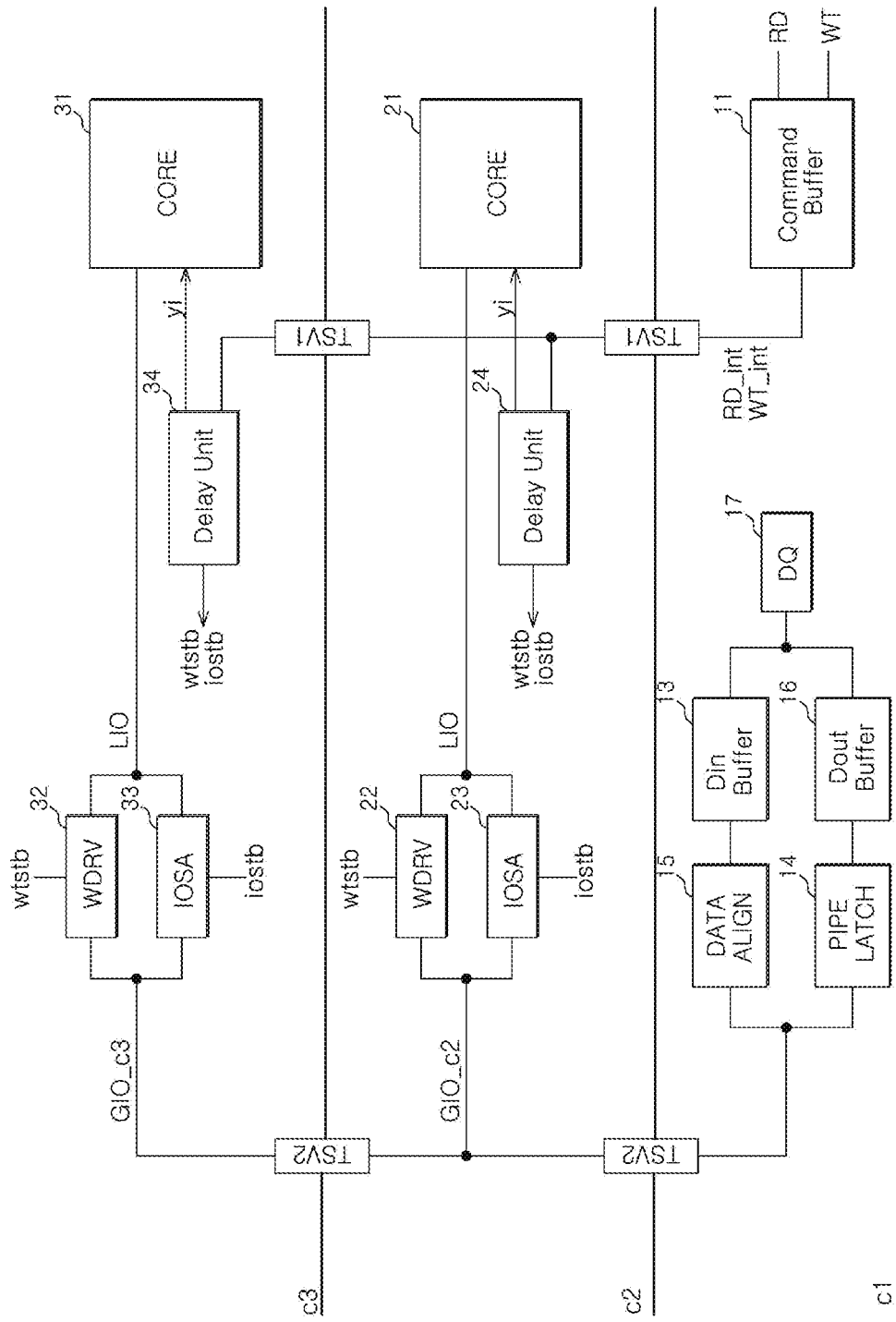
FIG. 1 is a diagram schematically illustrating the configuration of a conventional semiconductor apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
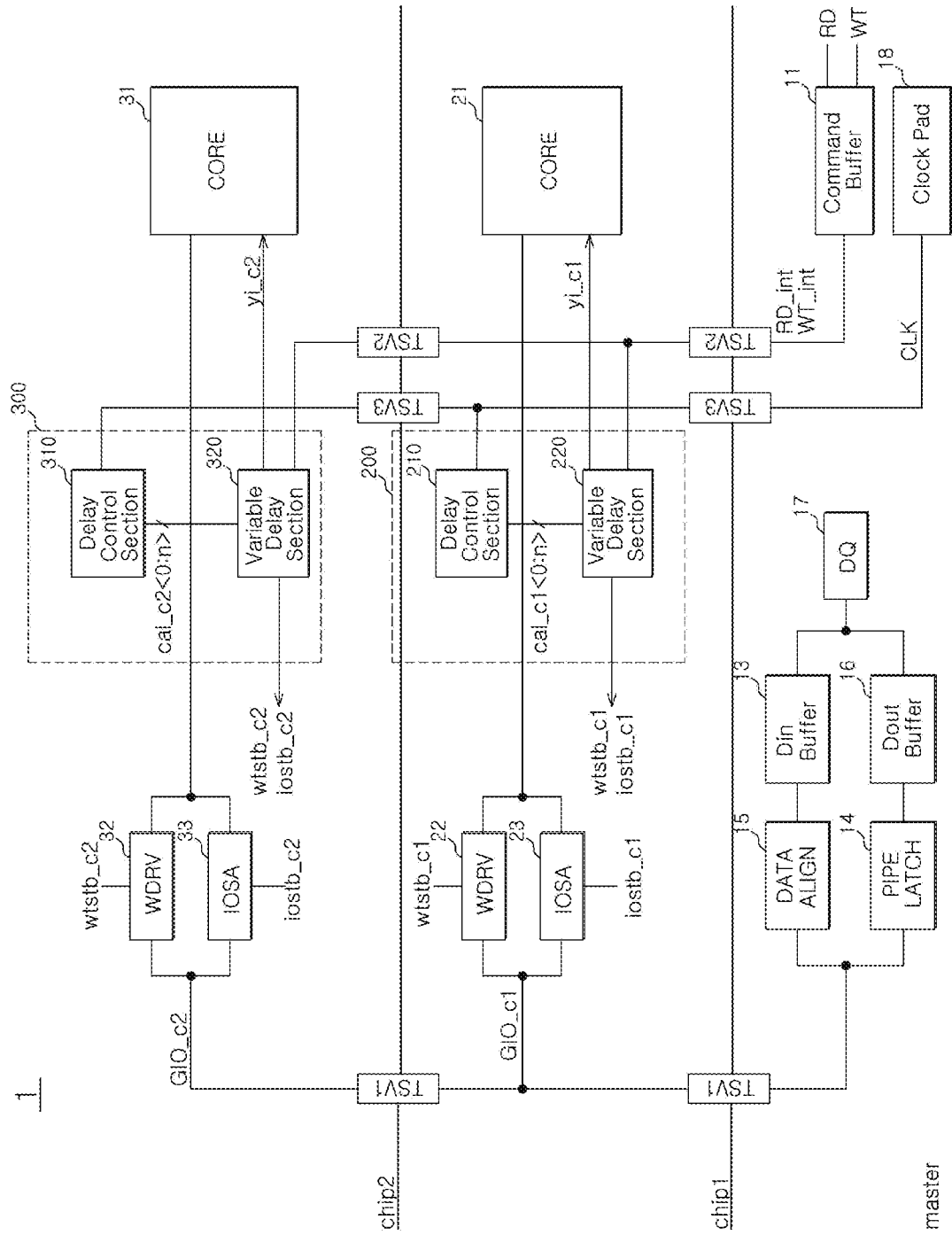
FIG. 2 is a diagram schematically illustrating the configuration of a semiconductor apparatus according to an embodiment of the present invention.

FIG. 2 illustrates an exemplary configuration of a semiconductor apparatus according to an embodiment of the present invention. As illustrated in FIG. 2, a master chip 'master' and first and second chips chip1 and chip2 are stacked, constituting a single semiconductor apparatus 1. There may be no limit to the number of stacked chips. The master chip 'master' and the first and second chips chip1 and chip 2 may be electrically connected by wires such as metal wires or through-silicon vias (TSVs) and operate as a single semiconductor apparatus. The master chip 'master' and the first and second chips chip1 and chip2 operate as a single semiconductor apparatus because data input/output lines GIO_c1 and GIO_c2 are connected with each other through first TSVs TSV1.

As illustrated in FIG. 2, the first and second chips chip1 and chip2 may operate as slave chips. The master chip 'master' may include a data input buffer 13, a data alignment unit 15, a pipe latch unit 14, and a data output buffer 16. A pad 17 inputs external data which the data input buffer 13 buffers. The data alignment unit 15 then aligns and outputs the buffered data, and the aligned data may be transmitted to the data input/output lines GIO_c1 and GIO_c2 of the first and second chips chip1 and chip2 through the first TSVs TSV1, respectively. The pipe latch unit 14 aligns the data transmitted through the data input/output lines GIO_c1 and GIO_c2 of the first and second chips chip1 and chip2 through the first TSVs TSV1. The data output buffer 16 buffers the data aligned by the pipe latch unit 14 and outputs the buffered data to the pad 17.

The master chip 'master' further includes a command buffer 11 and a clock pad 18. The command buffer 11 receives column commands from outside and generates internal column commands. The column commands include a read command RD and a write command WT. Accordingly, the command buffer 11 receives the read command RD and the write command WT and generates an internal read command RD_int and an internal write command WT_int. The internal read command RD_int and the internal write command WT_int which are generated by the command buffer 11 are transmitted to the first and second chips chip1 and chip2 through second TSVs TSV2. The master chip 'master' receives a clock signal CLK through the clock pad 18. The clock signal CLK is transmitted to the first and second chips chip1 and chip2 through third TSVs TSV3.

The first chip chip1 includes a first chip column control unit 200, a core unit 21, a write driver 22, and a read driver 23. The first chip column control unit 200 generates first chip column control signals from the internal column commands transmitted through the second TSV TSV2. The first chip column control unit 200 generates the first chip column control signals by delaying the internal column commands. The first chip column control unit 200 counts the number of times that the clock signal CLK toggles during a first time period and variably delays the internal column commands depending upon a counting result. The first time period may vary depending upon the PVT (process, voltage and temperature) variation characteristics of the first chip chip1. For example, in the case of a chip which has a small skew resulting from PVT variations, the first time period becomes a short time period, and in the case of a chip which has a large skew resulting from PVT variations, the first time period becomes a long time period. The first chip column control unit 200 may count the number of times that the clock signal CLK toggles regardless of PVT variations during the first time period that is changed depending upon the PVT variation characteristics of the first chip chip1, delay the internal column commands by an appropriate time, and generate the first chip column control signals.

The first chip column control signals are signals which are associated with the read and write operations of the first chip chip1, and include an input strobe signal wtstb_c1, an output strobe signal iostb_c1 and a column selection signal yi_c1. The input strobe signal wtstb_c1 is a signal which controls the operation of the write driver 22, and the output strobe signal iostb_c1 is a signal which controls the operation of the read driver 23. The column selection signal yi_c1 is a signal for selecting a column of the core unit 21 which is provided in the first chip chip1. The read or write operation may be performed for the column selected by the column selection signal yi_c1.

The write driver 22 amplifies the data transmitted through the first TSV TSV1 and the data input/output line GIO_c1 in response to the input strobe signal wtstb_c1. The amplified data may be stored in a memory bank which is included in the core unit 21. The read driver 23 amplifies the data stored in a memory bank of the core unit 21 in response to the output strobe signal iostb_c1. The data amplified by the read driver 23 may be inputted to the pipe latch unit 14 of the master chip 'master' through the data input/output line GIO_c1 and the first TSV TSV1.

The second chip chip2 has the same configuration as the first chip chip1. The second chip chip2 includes a second chip column control unit 300, a core unit 31, a write driver 32, and a read driver 33. Similar to the first chip column control unit 200, the second chip column control unit 300 generates second chip column control signals from the internal column commands. The second chip column control unit 300 counts the number of times that the clock signal CLK toggles during a second time period, variably delays the internal column commands depending upon a counting result, and generates the second chip column control signals. The second time period varies depending upon the PVT variation characteristics of the second chip chip2. For example, in the case of a chip which has a small skew resulting from PVT variations, the second time period becomes a short time, and in the case of a chip which has a large skew resulting from PVT variations, the second time period becomes a long time. The second chip column control unit 300 may count the number of times that the clock signal toggles CLK regardless of PVT variations during the second time period that is changed depending upon the PVT variations, delay the internal column commands by an appropriate time, and generate the second chip column control signals. The second chip column control signals are signals which are associated with the read and write operations of the second chip chip2, and include an input strobe signal wtstb_c2, an output strobe signal iostb_c2 and a column selection signal yi_c2. Since the core unit 31, the write driver 32 and the read driver 33 are respectively the same as the core unit 21, the write driver 22 and the read driver 23 of the first chip chip1, repeated descriptions thereof will be omitted herein.

Because the first chip chip1 generates the first chip column control signals by delaying the internal column commands depending upon the PVT variation characteristics of the first chip chip1 and the second chip chip2 generates the second chip column control signals by delaying the internal column commands depending upon the PVT variation characteristics of the second chip chip2, the time period from when the column commands are inputted till the first chip column control signals are generated and the time from when the column commands are inputted till the second chip column control signals are generated may be made to substantially coincide with each other. While it was exemplified in FIG. 2 that two chips are stacked, it is to be understood that the technical concept of the present invention may be applied to the case of three or more stacked chips. In this case, if the respective chips have column control units according to the embodiment of the present invention, the generation timing of the column control signals of the entire chips may be made to substantially coincide with each other.

In FIG. 2, the first chip column control unit 200 includes a delay control section 210 and a variable delay section 220. The delay control section 210 receives the clock signal CLK through the third TSV TSV3. The delay control section 210 counts the number of times that the clock signal CLK toggles during the first time period and generates a calibration signal cal_c1<0:n>. The variable delay section 220 receives the internal column commands through the second TSV TSV2 and variably delays the internal column commands in response to the calibration signal cal_c1<0:n>. The calibration signal cal_c1<0:n> may be a plural-bit signal. The variable delay section 220 changes a delay amount in response to the plural-bit calibration signal cal_c1<0:n>. Any known delay circuit capable of changing a delay amount in response to a plural-bit signal can be used for the variable delay section 220.

Similar to the first chip column control unit 200, the second chip column control unit 300 includes a delay control section 310 and a variable delay section 320. The delay control section 310 counts the number of times that the clock signal CLK toggles during the second time period and generates a calibration signal cal_c2<0:n>. Since the delay control section 310 and the variable delay section 320 of the second chip column control unit 300 are the same as the delay control section 210 and the variable delay section 220 of the first chip column control unit 200, repeated descriptions thereof will be omitted.

Figure 3:
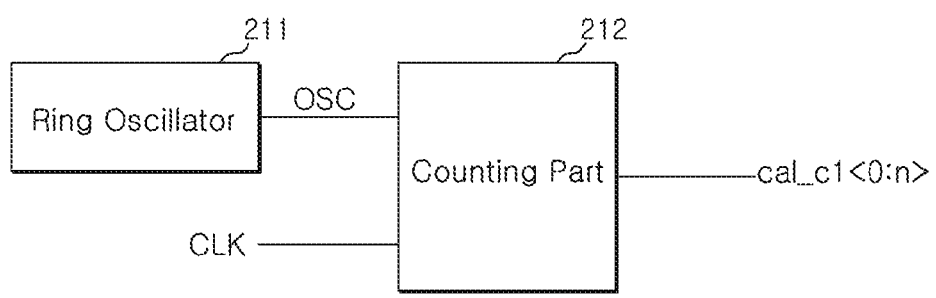
FIG. 3 is a block diagram schematically illustrating the configuration of a delay control section of a first chip column control unit shown in FIG. 2.

FIG. 3 is a block diagram schematically illustrating the configuration of the delay control section of the first chip column control unit shown in FIG. 2. Referring to FIG. 3, the delay control section 210 includes a ring oscillator 211 and a counting part 212. The ring oscillator 211 generates an enable signal OSC which is enabled for the first time period. Since the ring oscillator 211 is typically composed of a plurality of unit delay elements such as inverters, the ring oscillator 211 changes the enable time period of the enable signal OSC depending upon the PVT variation characteristics of the first chip chip1. That is to say, in the case where the first chip chip1 has a small skew resulting from PVT variations, the enable interval of the enable signal OSC is shortened, and in the case where the first chip chip1 has a large skew resulting from PVT variations, the enable interval of the enable signal OSC is lengthened.

The counting part 212 counts the number of times that the clock signal CLK toggles in response to the enable signal OSC and generates the calibration signal cal_c1<0:n>. The counting part 212 counts the number of times that the clock signal CLK toggles while the enable signal OSC is enabled. Accordingly, the counted number decreases if the enable interval of the enable signal OSC is short, whereas the counted number increases if the enable interval of the enable signal OSC is long. The calibration signal cal_c1<0:n> may be a plural-bit signal. For example, when the counting part 212 generates the calibration signal cal_c1<0:n> of 3 bits, if the clock signal CLK toggles four times during the enable interval of the enable signal OSC, the calibration signal cal_c1<0:n> may have bits of '1, 0, 0' which are up-counted four times from '0, 0, 0'. At this time, since the enable interval of the enable signal OSC is shortened if the first chip chip1 has a small skew, the calibration signal cal_c1<0:n> may have bits of '0, 1, 1'. On the other hand, since the enable interval of the enable signal OSC is lengthened if the first chip chip1 has a large skew, the calibration signal cal_c1<0:n> may have bits of '1, 0, 1'. Any well known counting circuit can be used as the counting part 212. The delay control section 310 of the second chip column control unit 300 has the same configuration as the delay control section 210 of the first chip column control unit 200.

Operations of the semiconductor apparatus 1 according to the embodiment of the present invention will be described below with reference to FIGS. 2 and 3. First, in a read operation, after the read command RD is applied from outside for read operation, the command buffer 11 generates the internal read command RD_int. The delay control section 210 of the first chip column control unit 200 counts the number of times of toggling of the clock signal CLK transmitted through the third TSV TSV3 for the first time period and generates the calibration signal cal_c1<0:n>. The variable delay section 220 delays the internal read command RD_int transmitted through the second TSV TSV2 in response to the calibration signal cal_c1<0:n>. If the first chip chip1 has a small skew resulting from PVT variations, the variable delay section 220 delays the internal read command RD_int more.

Similarly, the delay control section 310 of the second chip column control unit 300 counts the number of times of toggling of the clock signal CLK transmitted through the third TSVs TSV3 during the second time period and generates the calibration signal cal_c2<0:n>. The variable delay section 320 delays the internal read command RD_int transmitted through the second TSVs TSV2 in response to the calibration signal cal_c2<0:n>. If the second chip chip2 has a large skew resulting from PVT variations, the variable delay section 320 delays the internal read command RD_int less than the variable delay section 220 of the first chip column control unit 200. Thus, the generation timing of the first chip column control signals and the second chip column control signals are made to substantially coincide with each other.

Therefore, because the generation timing of the column selection signal yi_c1 inputted to the core unit 21 of the first chip chip1 and the output strobe signal iostb_c1 for controlling the operation of the read driver 23 coincide with the generation timing of the column selection signal yi_c2 inputted to the core unit 31 of the second chip chip2 and the output strobe signal iostb_c2 for controlling the operation of the read driver 33, the timing at which data are outputted from the first and second chips chip1 and chip2 are made to coincide with each other. As a result, the timing when the data from the first and second chips chip1 and chip2 are outputted externally through the pad 17 are made to substantially coincide with each other.

Next, in the write operation, when the write command WT is applied from outside for write operation, the command buffer 11 generates the internal write command WT_int. The data inputted from outside through the pad 17 is transmitted to the second TSVs TSV2 through the data input buffer 13 and the data alignment unit 15. The data is transmitted to the data input/output lines GIO_c1 and GIO_c2 of the first and second chips chip1 and chip2.

The delay control section 210 of the first chip column control unit 200 counts the number of times of toggling of the clock signal CLK transmitted through the third TSV TSV3 for the first time period and generates the calibration signal cal_c1<0:n>. The variable delay section 220 delays the internal write command WT_int transmitted through the second TSV TSV2 in response to the calibration signal cal_c1<0:n>. If the first chip chip1 has a small skew resulting from PVT variations, the variable delay section 220 delays the internal write command WT_int more.

Similarly, the delay control section 310 of the second chip column control unit 300 counts the number of times of toggling of the clock signal CLK transmitted through the third TSVs TSV3 during the second time period and generates the calibration signal cal_c2<0:n>. The variable delay section 320 delays the internal write command WT_int transmitted through the second TSVs TSV2 in response to the calibration signal cal_c2<0:n>. f the second chip chip2 has a large skew resulting from PVT variations, the variable delay section 320 delays the internal write command WT_int less than the variable delay section 220 of the first chip column control unit 200. Thus, the generation timing of the first chip column control signals and the second chip column control signals are made to substantially coincide with each other.

Therefore, because that the generation timing of the column selection signal yi_c1 inputted to the core unit 21 of the first chip chip1 and the input strobe signal wtstb_c1 for controlling the operation of the write driver 22 coincide with the generation timing of the column selection signal yi_c2 inputted to the core unit 31 of the second chip chip2 and the input strobe signal wtstb_c2 for controlling the operation of the write driver 32, the time period until the data transmitted through the second TSVs TSV2 are stored in the core units 21 and 31 through the write drivers 22 and 32 of the first and second chips chip1 and chip2 are made to correspond to each other. As a result, the time period until the external data inputted through the pad 17 are stored in the core units 21 and 31 of the first and second chips chip1 and chip2 are made to substantially correspond to each other.

As is apparent from the above description, in the present invention, since the generation timing of column control signals of a plurality of chips which constitute a single semiconductor apparatus are made to substantially coincide with each other, the timing when data are outputted from the respective chips and the timing when data are stored in core units of the respective chips are respectively made to substantially coincide with each other. As a consequence, a data valid window of the semiconductor apparatus may be increased, and the operating speed of the semiconductor apparatus may be elevated.

While the semiconductor apparatus using TSVs are illustrated in the embodiment of the present invention, those having ordinary knowledge in the art will appreciate that the technical concept of the present invention may be applied as it is to a semiconductor apparatus which uses wires in place of the TSVs.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a first chip column control unit disposed in a first chip and configured to variably delay an internal column command to generate a first chip column control signal; and
   a second chip column control unit disposed in a second chip and configured to variably delay the internal column command to generate a second chip column control signal,
   wherein the first chip column control unit comprises a first delay control section configured to count a first number of times that a clock signal toggles during a first time period and to generate a first calibration signal, and a first variable delay section configured to variably delay the internal column command in response to the first calibration signal and to generate the first chip column control signal, and
   wherein the first delay control section comprises a first ring oscillator configured to generate an enable signal which is enabled during the first time period, and a first counting part configured to count the first number of times that the clock signal toggles in response to the enable signal and to generate the first calibration signal.

2. The semiconductor apparatus according to claim 1, wherein the first chip column control signal is one of an input strobe signal, an output strobe signal, and a column selection signal.

3. The semiconductor apparatus according to claim 1, wherein the first time period is changed depending upon variation in one of process, voltage, and temperature characteristics of the first chip.

4. The semiconductor apparatus according to claim 1, wherein the second chip column control signal is one of an input strobe signal, an output strobe signal, and a column selection signal.

5. The semiconductor apparatus according to claim 1, wherein the second chip column control unit comprises:
   a second delay control section configured to count a second number of times that the clock signal toggles during a second time period and generate a second calibration signal; and a second variable delay section configured to variably delay the internal column command in response to the second calibration signal and generate the second chip column control signal.

6. The semiconductor apparatus according to claim 5, wherein the second delay control section comprises:
   a second ring oscillator configured to generate an enable signal which is enabled during the second time period; and
   a second counting part configured to count the second number of times that the clock signal toggles in response to the enable signal and generate the second calibration signal.

7. The semiconductor apparatus according to claim 1, wherein the clock signal is transmitted to the first and second chips through a first through-silicon via.

8. The semiconductor apparatus according to claim 1, further comprising:
   a command buffer disposed in a third chip and configured to generate the internal column command from the column command.

9. The semiconductor apparatus according to claim 8, wherein the column command is one of a read command and a write command.

10. The semiconductor apparatus according to claim 8, wherein the internal column commands are transmitted to the first and second chips through a second TSV.

11. The semiconductor apparatus according to claim 5, wherein the second time period is changed depending upon variation in one of process, voltage, and temperature characteristics of the second chip.

* * * * *